(12) United States Patent
Bates et al.

(10) Patent No.: US 6,635,958 B2
(45) Date of Patent: Oct. 21, 2003

(54) SURFACE MOUNT CERAMIC PACKAGE

(75) Inventors: David A. Bates, Fayetteville, NY (US);
Stephen J. Oot, Whitesboro, NY (US);
Robert J. Street, Manlius, NY (US);
Brian L. Rowden, Fayetteville, NY (US)

(73) Assignee: Dover Capital Formation Group, Cazenovia, NY (US)

( * ) Notice: Subject to any disclaimer, the term of this patent is extended or adjusted under 35 U.S.C. 154(b) by 64 days.

(21) Appl. No.: 10/005,703

(22) Filed: Dec. 3, 2001

(65) Prior Publication Data

US 2003/0111714 A1 Jun. 19, 2003

(51) Int. Cl.[7] .............................................. H01L 23/15
(52) U.S. Cl. ...................... 257/703; 257/700; 257/701; 257/668
(58) Field of Search ................................ 257/703, 700, 257/701, 712, 713, 717, 720, 675, 666, 658, 668, 774

(56) References Cited

U.S. PATENT DOCUMENTS

| | | | | |
|---|---|---|---|---|
| 4,907,067 A | * | 3/1990 | Derryberry | 257/700 |
| 5,223,741 A | * | 6/1993 | Bechtel et al. | 257/678 |
| 5,229,727 A | | 7/1993 | Clark et al. | 333/33 |
| 5,270,673 A | | 12/1993 | Fries et al. | 333/246 |
| 5,389,904 A | | 2/1995 | Tao et al. | 333/246 |
| 5,753,972 A | * | 5/1998 | Wein et al. | 257/691 |
| 5,900,312 A | * | 5/1999 | Sylvester | 428/322.7 |
| 6,124,636 A | | 9/2000 | Kusamitsu | 257/728 |
| 6,147,389 A | * | 11/2000 | Stern et al. | 257/434 |
| 6,172,412 B1 | | 1/2001 | Wein et al. | 257/664 |
| 6,248,959 B1 | * | 6/2001 | Sylvester | 174/256 |
| 6,271,579 B1 | * | 8/2001 | Going et al. | 257/664 |
| 6,509,531 B2 | * | 1/2003 | Sakai et al. | 174/264 |

* cited by examiner

Primary Examiner—Nathan J. Flynn
Assistant Examiner—Pershelle Greene
(74) Attorney, Agent, or Firm—Bernhard P. Molldrem, Jr.

(57) ABSTRACT

A surface mount ceramic package, e.g. for a microwave or millimeter wave integrated circuit device, has outer conductive pads that are available for direct connection with traces on the printed circuit board. A metal core or base has spaces at one or more sides, e.g., voids or cutouts, where the outer pads are located. There is a first ceramic layer disposed on the core, with a central cavity for the die, and an upper or second ceramic layer. Printed traces are buried between the two layers, and vias connect the traces with the outer pads. Inner pads are located on a ledge of the first layer adjacent the cavity for connection with electrodes of the die. Each of the first and second ceramic layers may be stacked ceramic tape. The package may be LTCC or HTCC. This construction avoids inductive losses, especially at higher frequencies.

9 Claims, 4 Drawing Sheets

SURFACE MOUNT CERAMIC PACKAGE

BACKGROUND OF THE INVENTION

This invention relates to ceramic packages and other housings used for enclosing or housing active and passive electronic devices, e.g., transistors, resistors, and capacitors, and in particular integrated circuits, such as MMICs or monolithic microwave integrated circuits. The invention is more particularly concerned with a construction of ceramic packages that are adapted to be surface-mounted onto a printed circuit board. That is, the package itself is to be soldered or bonded directly to microstrips or other metal traces on the printed circuit board. The invention is also concerned with minimizing inductive impedance as much as possible in the signal paths into and out of the integrated circuit device that is contained within the ceramic package.

Ceramic packaging is commonly used housing for small integrated circuits and other solid-state electronic devices. Co-fired ceramic enclosures are often employed as packages, and the advantages of them are well known. The integrated circuit is typically housed in or on a ceramic substrate, or in a cavity within the substrate, and metallized feed-throughs connect the integrated circuit with the outside of the package. Many packages have a metal base or core that serves as a ground plane, and some packages incorporate a metal slug for improved heat removal. Commonly, thick film or screen printing techniques are used to form the traces. These can be applied as a conductive ink to the green tape, and co-fired with the green tape. Alternatively, the traces can be printed onto fully-fired ceramic substrates, e.g., stacked prefired ceramic. Some packages are formed of a molded polymer for the package wall, with an embedded lead frame. Metal leads, typically Kovar™ or copper ribbons, are soldered or brazed onto the metal traces to provide connections from the package to exterior circuitry. Printed feed-throughs have to be matched to a transmission line, which is typically a microstrip that is printed on the circuit board, and wire bonds, ribbon bonds, or leads at this point create an inductance, which can result in undesirable insertion loss, especially at higher frequencies.

For high frequency circuit packaging of digital or analog circuits, e.g., in the microwave and millimeter wave frequencies, controlled impedance feed-throughs and interconnections are provided to control signal reflections and losses to acceptable levels. Most components of this type are designed for nominal 50 ohm impedance for their high-frequency connections. To realize feed-throughs of a specified characteristic impedance requires careful design of conductor geometry, which requires consideration of dielectric thickness and permittivity, as well as ground geometry. At high frequencies, many feed-through structures will support higher order modes of transmission and resonances, and have dispersive propagation degrading characteristics (i.e., frequency-dependent characteristic impedance and propagation velocity) thereby degrading signal fidelity. To reduce or minimize these deleterious effects, thinner dielectric substrates are used. For frequencies of 40 GHz or above, substrate thickness of 0.010 inches or less is desirable. Substrate thickness refers to the separation between the ground plane and the microstrip transmission line or lines, i.e., conductive I/O signal traces. For typical packages made of co-fired alumina, frequently referred to as HTCC, with a dielectric constant of about 9, the metal trace widths are only about 0.01 inches in order to maintain the nominal 50 ohm characteristic impedance.

Keeping in mind that the traces on a well-designed microwave package are themselves controlled impedance transmission lines, and that the interconnect substrate can typically be a printed circuit board of appropriate material and thickness for high frequency operation, the lead lengths between the package and the printed circuit board traces should be kept extremely short in order to achieve broadband performance (typically, DC to 40 GHz or more) with low-loss interconnection.

Consequently, the industry has sought a package arrangement that permits the transmission line conductors on the package to be connected to the microstrip conductors on the printed circuit board with a minimum of signal loss. It has also been a desire to simplify the job of installation of the packaged integrated circuits onto the printed circuit board. A surface-mount construction, wherein all package signal and ground connections lie in the same plane, would appear to address these issues, but no satisfactory surface mount package has appeared for this application. Typical surface-mount packages employ metallic vias through a dielectric layer (preferably, ceramic) which transfers both signal and ground connections from the device to the package mounting surface.

The typical surface mounted device (SMD) package is attached to the upper surface of a printed circuit board (preferably using solder) wherein electrical grounds (both DC and RF) and much of the heat generated by the packaged device, are carried to chassis, i.e., cold plate and chassis ground, by a number of metallized vias in the printed circuit board. Controlled impedance interconnects, which are a necessity for millimeter wave operation, require attention not only to signal trace geometry but also to ground current path geometry. Prior art surfacemount packages demonstrate a degraded performance above about 20 GHz due to the inadequate ground integrity of metallized vias, particularly the combination of series connected ground vias through the package base plus the printed circuit board. This ground-integrity issue manifests itself in significant resonance effects, which produce rapid increases in signal loss, reflection, and radiation above a threshold frequency for the package/circuit board combination.

OBJECTS AND SUMMARY OF THE INVENTION

Accordingly, it is an object of the present invention to provide a ceramic package that avoids the drawbacks of the prior art, and in particular which may be surface mountable so as to avoid problems that may arise from conventional package designs.

It is a further object to provide a ceramic package in which input and output pads on the exterior of the package can be directly connected to the associated outside circuitry, e.g., with solder or with an isotropic conductive adhesive, so as to avoid inductive losses that are characteristic of wire or ribbon bonds, or leads in the signal connections.

It is a further object to avoid inductive losses and resonances caused by package via grounding and printed circuit board grounding.

It is another object to create a surface mount ceramic package that facilitates automated installation of the package onto the associated printed circuit board.

It is yet another object to enhance thermal conduction from the packaged device to the system heat sink using package base materials that possess high thermal conductivity.

In accordance with an aspect of the present invention, a ceramic package for a microwave or millimeter wave or high density integrated circuit, is adapted to be mounted directly onto a printed circuit board on which there are metallized traces. The package has a flat core formed of a material that is thermally and electrically conductive. This may be Kovar, Cu/W, Cu/Mo, or another suitable metal, or may be a ceramic material that is metallized on its upper and lower surfaces and may contain vias to connect the upper and lower surfaces, or a ceramic base which is metallized on all sides, or a semiconductor such as silicon which is doped for electrical conductivity. The ceramic material can be applied by a low-temperature co-fired ceramic technique, in which green tape is cut and stacked onto the core or base layer. The ceramic material can be considered to have a first ceramic layer applied onto the core of Kovar, Cu/W, Cu/Mo, or other suitable material, and a second ceramic layer atop the first layer. The first ceramic layer, which is disposed on the core, is formed with a cavity therein, and the high density integrated circuit, in the form of a semiconductor die, lies on the core with the first ceramic layer surrounding the cavity. Metallized feed-throughs are formed on an upper surface of the first ceramic layer, each feed-through extending to an inner metallized pad adjacent the cavity. The second ceramic layer is disposed on the upper surface of said first ceramic layer and encircles the cavity, so that the second layer covers the feed-throughs but leaves the inner pads available for bonding to the die.

Outer metallized pads are formed on a lower surface of the first ceramic layer for connecting electrically onto the metallized traces of the printed circuit board, while metal vias in the first ceramic layer, or other suitable conductor means, connect the outer metallized pads to respective interior contact pads for the feed-throughs. In order to accommodate these downward-facing outer conductive pads, the core is formed with one or more peripheral cutouts or accesses that permit access to the lower surface of the first ceramic layer at the locations of the outer pads. This construction permits the outer pads to be connected directly to the printed circuit board metal traces.

In one possible embodiment, the lower surface of the first ceramic layer is substantially in the plane of the upper surface of the core, such that the outer pads are elevated somewhat above the bottom side, i.e., lower surface, of the core. In another possible embodiment, ceramic material is present within the cutout portions of the core, that is, a portion of the first ceramic layer where the outer pads are located extends down into one or more of the cutouts. Another alternative embodiment employs a continuous ring of ceramic material around the perimeter of the core, with the ring being substantially coplanar with the bottom face of the core. Yet another embodiment can employ a core and a one-layer wall structure, with interconnects; with a dome lid or cover being used over the packaged device. The wall structure in this embodiment may be ceramic, dielectric polymer, ceramic/polymer combination, or other suitable material.

The packaged integrated circuits can be installed on the printed circuit board by placing the package(s) at the appropriate location(s) and passing the printed circuit board through a reflow furnace. Alternatively, an isotropic conductive adhesive, or a solder-ball system may be used to attach the connection pads to the printed traces on the board.

The above and many other objects, features, and advantages of this invention will become apparent from the ensuing description of selected preferred embodiments, which are to be considered in connection with the accompanying Drawing.

BRIEF DESCRIPTION OF THE DRAWING

FIG. 4 is taken at line 4—4 of this view.

DETAILED DESCRIPTION OF THE PREFERRED EMBODIMENTS

Figure 1:
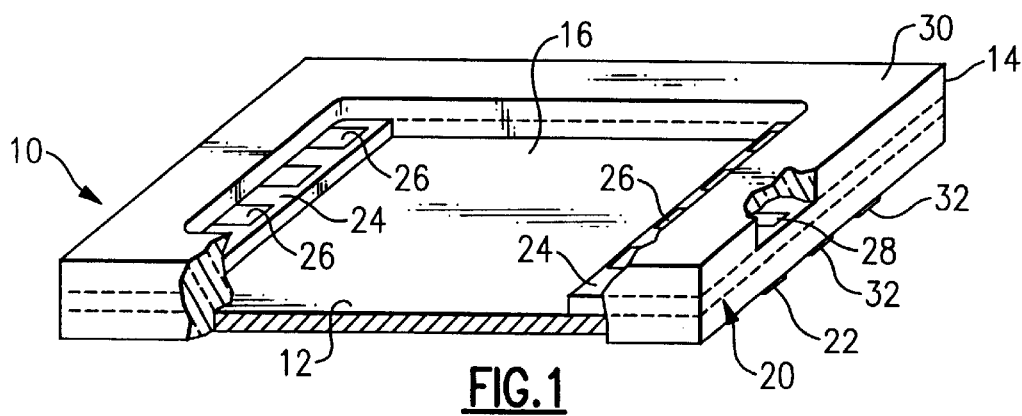
FIG. 1 is perspective view partly cut away of a surface mount ceramic package according to one embodiment of this invention.
Figure 2:
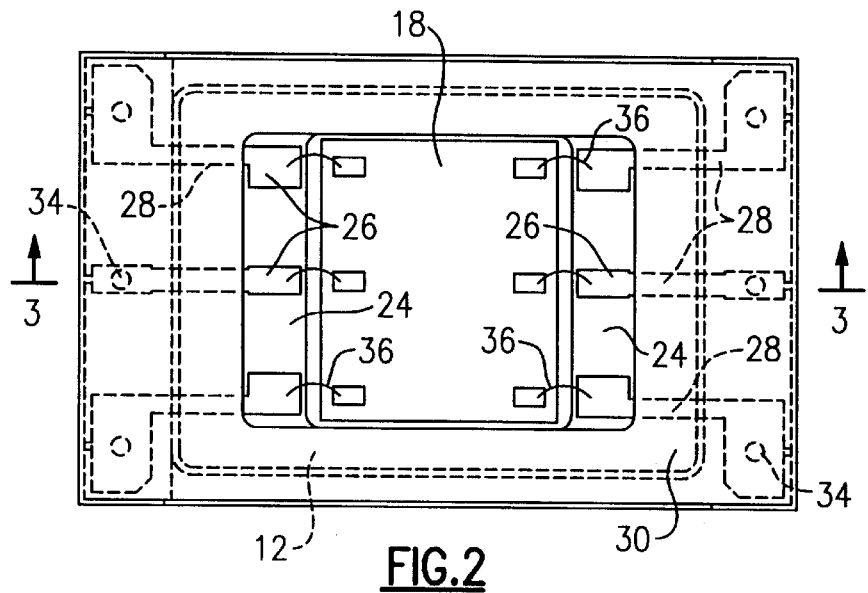
FIG. 2 is a top plan view of this embodiment.
Figure 3:
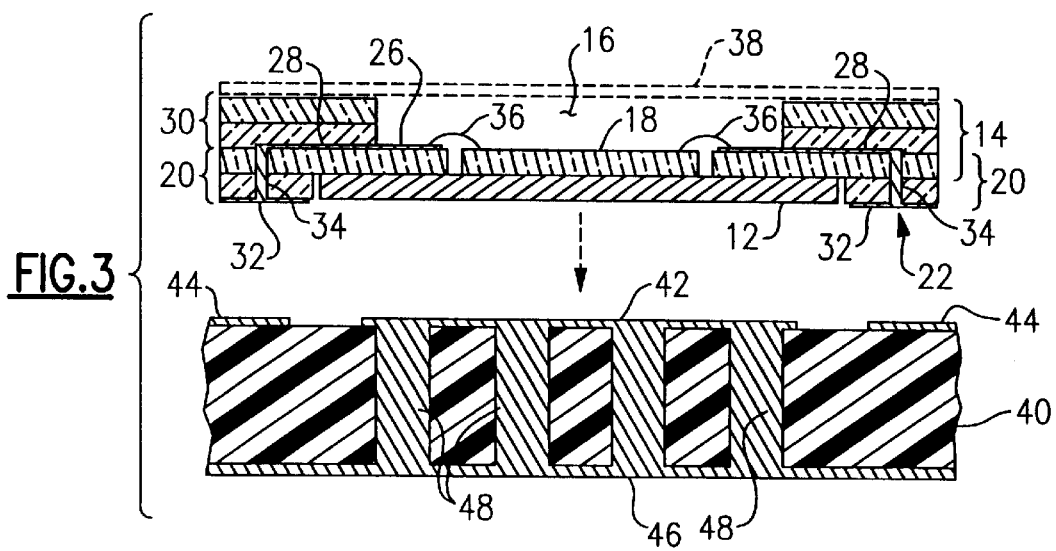
FIG. 3 is a sectional assembly view of the FIG. 1 embodiment, and a portion of an associated printed circuit board.

With reference to the Drawing, and initially to FIGS. 1 to 3, an embodiment of a surface mount, or lead-less ceramic package 10 has a core or base 12 in the form of a thermally and electrically conductive plate. This can be MoCu, WCu, Kovar™ or a similar alloy which has a thermal expansion coefficient close to that of alumina or other ceramic material, as well as being close in thermal expansion coefficient to components which are to be mounted in the package. It is also possible to use a ceramic plate that is coated with a conductive layer on each side. A ceramic wall 14, i.e., a ring or surround 14 formed or affixed onto it. Preferably, this is formed by a low-temperature co-fired ceramic process, with the ceramic being constructed from a stack of layers of green tape on the core or base 12. A void or cavity 16 in the ceramic wall is adapted to receive an integrated circuit die 18, such as a millimeter-wave MMIC, with the die 18 lying on the upper surface of the core 12 within the cavity 16. A first layer or base layer 20 of ceramic material, which can be composed of one or more layers of ceramic tape, is positioned on the core 12, with some ceramic material extending downward into notches or cutouts in the core. The ceramic material above the core is in the form of a ring, and defines the cavity 16, with the first ceramic layer 20 surrounding the cavity 16. A portion 22 of the ceramic material at the periphery of the core 12 extends down below the top surface of the core. There may be one or more cutouts in the periphery of the core for this portion. In other embodiments, this portion 22 of the ceramic material may equivalently overhang the periphery of the core 12. An alternative arrangement will be described below with reference to FIGS. 1A and 2A.

At the margin adjacent the cavity 16 there is a shelf portion 24 of the first layer, where inner conductive pads 26 are printed atop the layer 20. Metal traces, i.e., feed throughs, extend outward from the pads 26.

A second or upper ceramic layer 30 is disposed over the first layer 20, except at the shelves 24. This layer, which surrounds the cavity 16, may also be formed of one or more than one layer of a ceramic tape.

On the lower surface of the first layer 20 at the portions 22, outer conductive pads 32 are formed, which are employed in making connections with external circuitry. These are aligned with the metal traces or feed throughs 28, and conductive vias 34 extend vertically in the first ceramic layer 20 to connect the outer pads 32 with the respective feed throughs 28.

Here, wire bonds 36 are shown for connecting the inner conductive pads 26 to respective electrodes on the die 18. A lid or cover 38 (shown in broken lines) is positioned atop the second ceramic layer to seal off the cavity 16. The pads and feed-throughs can be printed onto the green tape with suitable conductive ink using a thick-film technique, and then co-fired with the green tape.

Figure 1A:
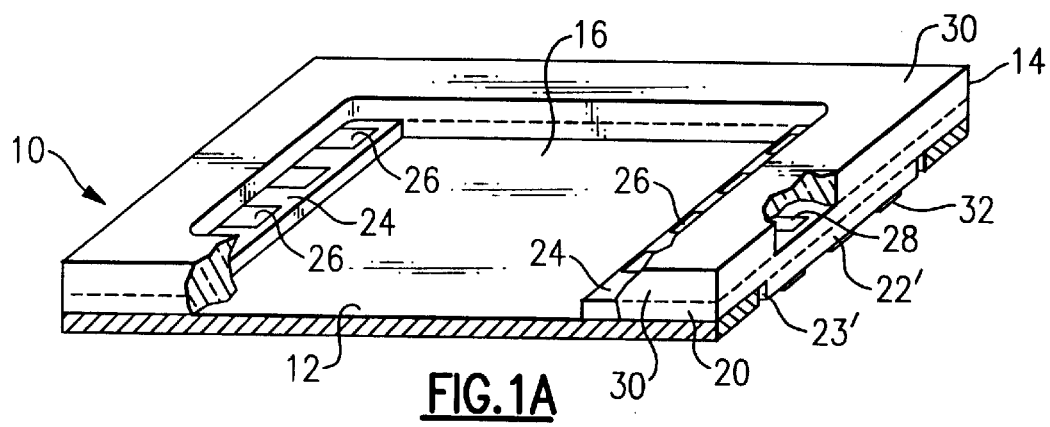
FIGS. 1A and 2A are perspective and top plan views, respectively, of an alternative embodiment.
Figure 2A:
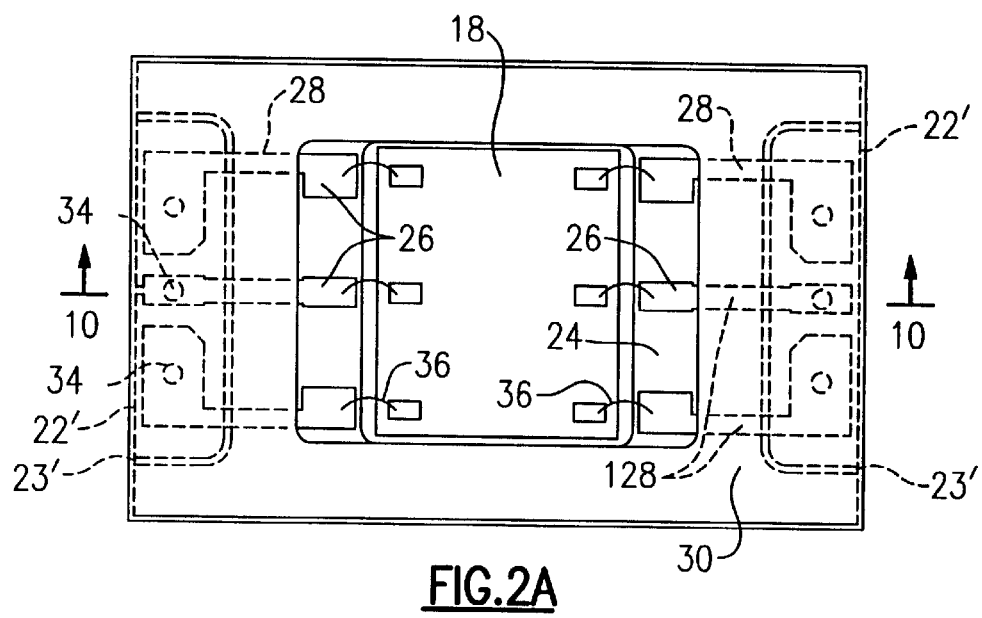

An alternative arrangement of this embodiment is illustrated with reference to FIGS. 1A and 2A, for which the same reference numbers identify similar elements. A general discussion of these elements need not be repeated here. This arrangement is structurally similar to the embodiment of FIGS. 1 and 2, except that there are notches or cutouts 23' on opposed ends of the core or base 12, i.e., at the left and right in the Drawing, and a portion 22' of the ceramic material extends downward into these two notches or cutouts 23'. There are conductors, vias, and pads disposed in the ceramic material at the positions of these two portions 22'. Again, the lower surface of the core or base 12' is substantially flush with the lower surface of the ceramic portions 22' on which the contact pads 32' are situated.

The ceramic package 10 can be mounted onto a printed circuit board 40 in the manner generally shown in FIG. 3. The board 40, formed of a suitable non-conductive material, has a metallized area 42 that serves as a heat sink and electrical ground, and has metal traces 44 serving as microstrip conductors to connect with signal input and output electrodes on the package 10. There is a grounding pad 46 on the under side of the circuit board 40 which is in contact with a metal chassis that serves as equipment ground and heat sink, and metal vias 48 through the thickness of the board 40 connect the metallized area 42 and the grounding pad 46. The metallized outer pads 32, 32 of the package are connected to the metal traces 44, 44 using a solder attachment technique, and the under side of the core 12 is likewise connected to the metallized area 42 by a solder attachment. These solder connections can be accomplished using a reflow technique.

The surface mount package arrangement of this embodiment avoids the need for leads, wire bonds or ribbon bonds between the printed circuit board and the electrodes of the package, and thus reduces the signal insertion loss at the signal input and output electrodes, especially in the higher frequencies, e.g., tens of gigahertz. It can be appreciated that the surface mount arrangement of this invention treats the signal input and output electrodes as transmission lines, and maintains transmission line behavior as much as possible at the connections and feed throughs.

The die may be joined to the core using a typical Au/Sn solder having a nominal 280° C. melting point. The lower surface of the core 12 and the outer conductive pads 32 may be joined to the circuit board metallization using conductive die attaches, typically solder (Sn62).

Alternatively to the low temperature ceramic or LTCC, a high temperature co-fired ceramic or HTCC technique can be used, e.g., an alumina, with tungsten or molybdenum traces or other higher resistance traces.

Figure 4:
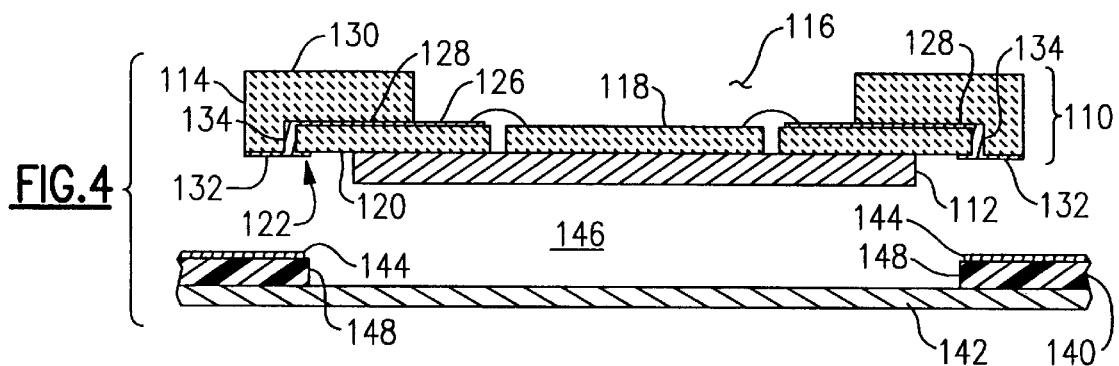
FIG. 4 is a sectional assembly view of another embodiment of a surface mount ceramic package of this invention.
Figure 5:
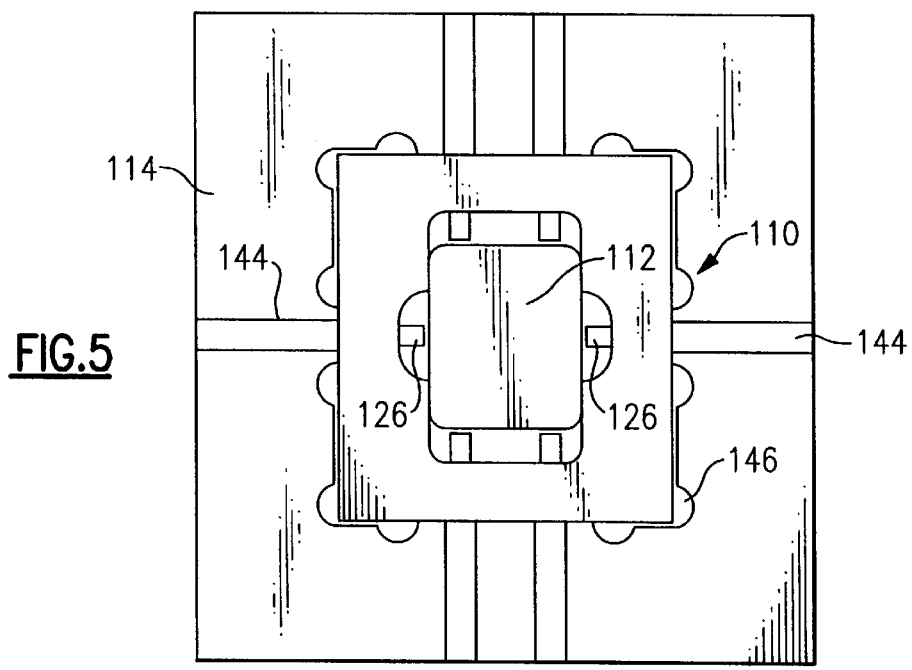
FIG. 5 is a plan view of this embodiment.
Figure 6:
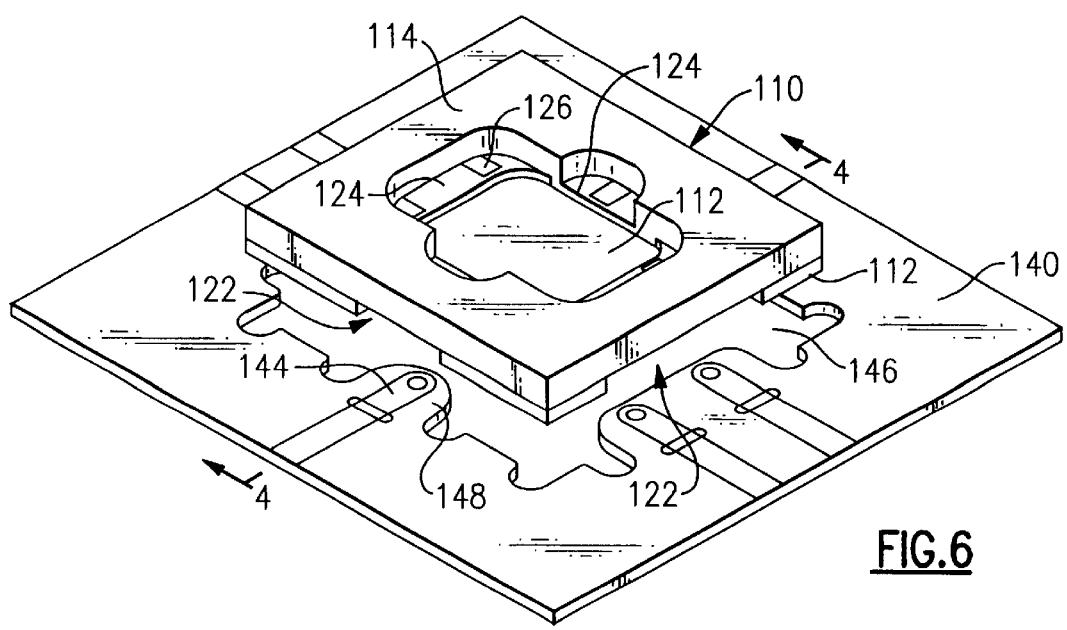
FIG. 6 is a perspective view of this embodiment.

Another embodiment of the ceramic package of this invention is shown in FIGS. 4, 5, and 6. Here, parts that correspond to elements of the previous embodiment are identified with similar reference numbers, but raised by 100. In this package 110 there is a flat MoCu, WCu, or Kovar™ core 112 and a ceramic wall or surround 114. The core 112 has cutouts 122 at its side edges. The ceramic wall has a first ceramic layer 120 situated on the upper surface of the core 112 with a cavity 116 formed at its center, and as in the first embodiment there are shelves 124 adjacent the cavity on which are provided inner conductive pads 126 for making wire bond connections to the die. Metallized traces 128 extend out from these pads 126 and are buried beneath an upper ceramic layer 130. Outer conductive pads 132 are provided at the underside of the first ceramic layer 120 at the locations of the cutouts 122, and conductive vias 134 extend vertically through the first ceramic layer to connect the pads 132 with the traces 128.

In contrast to the first embodiment, in this embodiment the first layer 120 does not extend down beneath the top surface of the core 112. Instead the positions on the printed circuit board where the packaged component is to be installed is provided with a cut out or receptacle to accommodate the package.

As shown here, the printed circuit board 140 is situated atop a heat-sink grounded chassis or plate 142, and has metal traces 144 on its upper side, which traces 144 may be microstrips. A cutout 146 of sufficient dimension to accommodate the package 110 is provided through the board 140, so that the core 112 of the package seats directly onto the chassis or plate 142. In this arrangement, there are peninsulas 148 that extend into the cutout 146 and carry the traces 144 to a location where they may contact the outer conductive pads 132 of the package. A cover or lid seals off the cavity 116, but the lid is omitted here for clarity.

A conductive attach, e.g., Sn 62 solder, may be used to attach the traces 144 to the pads 132, and may also be used to attach the lower surface of the package 112 to the chassis 142. This construction, with the dies seated directly on the grounded plate, minimizes ground inductance which eliminates resonances at high frequencies. As a consequence, the package design results in greater bandwidth, and minimizes thermal resistance. Also, the geometry of this design minimizes wire bond and interconnect inductance, thereby enhancing bandwidth. With proper printed circuit board cut out design, the package signal contacts 132 are registered to signal traces 144 with improved physical precision. This leads to improved repeatability, lower VSWR, and consequently lower transmission loss at millimeter-wave frequencies.

Figure 7:
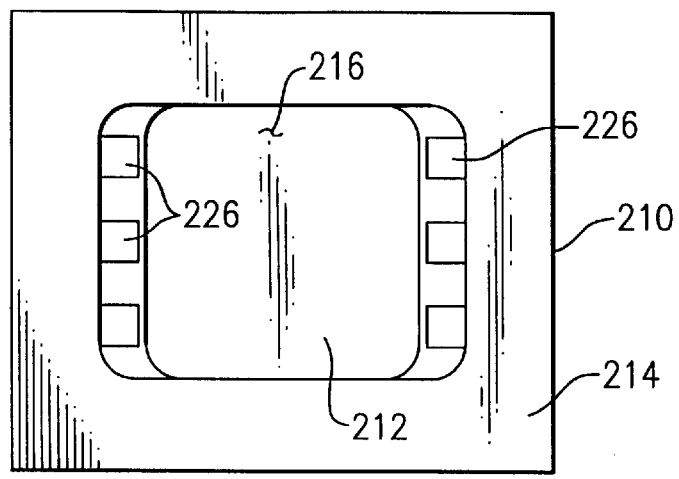
FIG. 7 is a top plan view.
Figure 8:
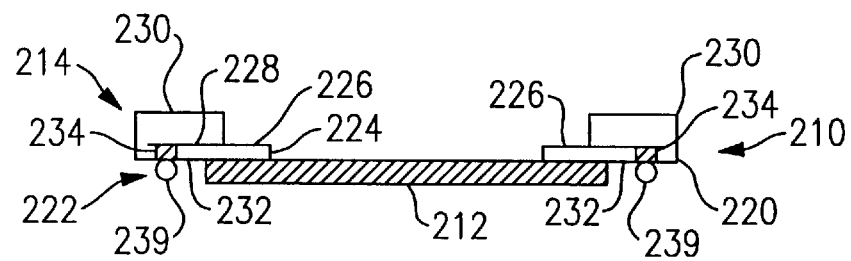
FIG. 8 is a sectional elevation.
Figure 9:
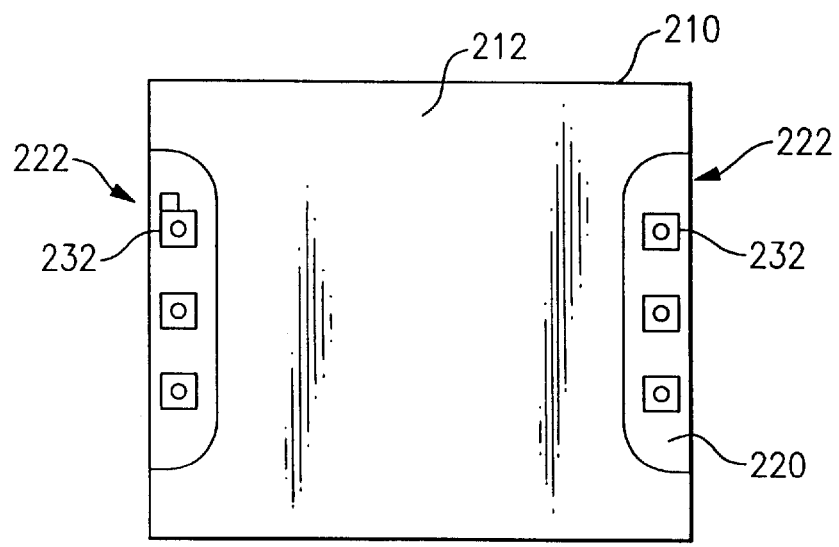
FIG. 9 is a bottom plan view of a surface mount ceramic package according to another embodiment of this invention.

Another possible embodiment of the ceramic package of this invention is shown in FIGS. 7, 8, and 9. Similar elements to what is shown in the first embodiment are identified with similar reference numbers, but raised by 200. The package 210 has a core or metal base 212 and a ceramic surround 214 containing a cavity 216 for positioning a semiconductor die. As in the previous embodiments, there are inner conductive pads 226 adjacent the cavity 216 atop protruding ledges or shelves 224 of a first ceramic layer 220, and metal traces 228 buried between the first ceramic layer 220 and an upper of second ceramic layer 230. Outer conductive pads 232 are formed on an underside of the first ceramic layer 220, and vias 234 in this layer connect the pads 232 with the respective metal traces 228. In this package 210 there are cutouts or voids 222 in the side edges of the core 212 at the locations of the conductive pads. Solder balls 239 or other conductive attachments can be used to connect the outer pads 232 to external conductors beneath (not shown), which brings the external contacts substantially into coplanarity with the back plane of the core. As with the other embodiments, a lid or cover (not shown) seals off the cavity 216.

In still other possible embodiments, the core can be unitarily formed as a part of the first or lower ceramic layer by forming plated or filled vias therein with conductive pads on both upper and lower surfaces at the location where the die is to be seated.

Figure 10:
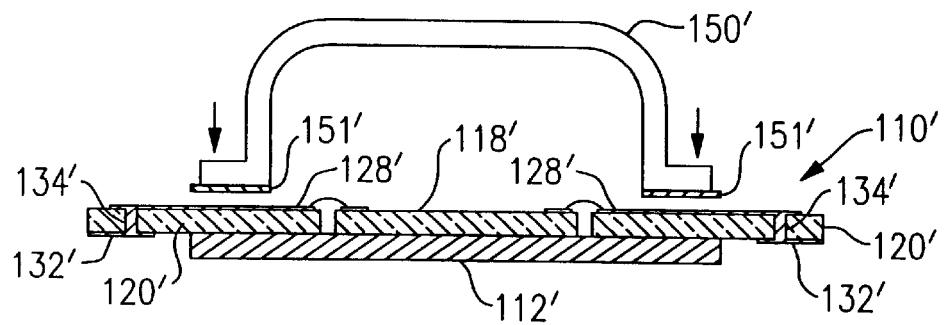
FIG. 10 is a cross sectional view of another embodiment of the invention.

Another possible SMD package is generally illustrated in FIG. 10 to accommodate a domed lid rather than a flat lid. In FIG. 10 elements that have been introduced in respect to an earlier embodiment are identified with the same reference numbers, with a prime. Here, a millimeter wave package 110' is shown in a cross sectional elevation, with a core 112', a ceramic layer 120' atop the core, and with metal traces 128', vias 134', and external contact pads 132'. In this package 110' after a millimeter wave chip or device 118' is installed, a domed lid or cover 150' is secured over it, using an electrically insulating adhesive material 151'. The domed lid or cover 150' may be made of an insulating ceramic, a plastic material, or other material as desired. An alternate embodiment of FIG. 10 could replace ceramic layer 120' with a polymer or suitable printed circuit board material.

The embodiments illustrated here employ transmission lines on both the printed circuit board and the package which are principally microstrips. Alternate embodiments could employ combinations of transmission line types such as, but not limited to, grounded coplanar waveguide, coplanar waveguide, stripline, coplanar strip, and microstrip.

While the invention has been described hereinabove with reference to certain preferred embodiments, it should be recognized that the invention is not limited to those precise embodiments. Rather, many modification and variations would present themselves to persons skilled in the art without departing from the scope and spirit of this invention, as defined in the appended claims.

We claim:

1. A surface mount ceramic package for housing an integrated circuit die and adapted to be mounted directly onto a printed circuit board on which there are metallized traces; comprising
    a flat core formed of a material that is thermally and electrically conductive;
    a first ceramic layer disposed on said core and having a cavity formed therein in which said die lies on said core with the first ceramic layer surrounding said cavity;
    a plurality of metallized feed-throughs formed on an upper surface of said first ceramic layer, each feed-through extending to an inner metallized pad adjacent said cavity;
    a second ceramic layer disposed on the upper surface of said first ceramic layer and encircling said cavity and covering said metallized feed-throughs but leaving said inner pads available for bonding to said die;
    outer metallized pads on a lower surface of said first ceramic layer for connecting electrically onto the metallized traces of said printed circuit board; and
    conductor means within said first ceramic layer connecting said outer metallized pads to respective ones of said feed-throughs;
    and wherein said core has one or more peripheral access portions that permit access to the lower surface of said first ceramic layer at locations of said outer pads to permit the outer pads to be connected directly to the printed circuit board metal traces.

2. The surface mount ceramic package according to claim 1 wherein a portion of said first ceramic layer where said outer pads are located extends down into one or more of said access portions.

3. The surface mount ceramic package according to claim 1 wherein said first and second ceramic layers are co-fired and are each formed of one or more layers of ceramic tape.

4. The surface mount ceramic package according to claim 1 wherein the lower surface of said first ceramic layer is substantially in a plane of an upper surface of said core, such that the outer pads are disposed above a lower surface of said core.

5. The surface mount ceramic package according to claim 1 wherein said conductor means includes conductive vias extending vertically through said first ceramic layer.

6. The surface mount ceramic package according to claim 1 wherein said second ceramic layer has a greater internal dimension at said cavity than said first ceramic layer, such as to create one or more ledges adjacent said cavity where said inner pads are located.

7. The surface mount ceramic package according to claim 1 wherein said feed-throughs are buried beneath said second ceramic layer except at said inner pads.

8. The surface mount ceramic package according to claim 1 wherein said peripheral access portions include at least one cutout at the periphery of said core.

9. The surface mount ceramic package according to claim 1 wherein said peripheral access portions include a marginal portion of the core which the first ceramic layer overhangs.

* * * * *